United States Patent [19]

Bucksch

[11] Patent Number: 5,600,176
[45] Date of Patent: Feb. 4, 1997

[54] INTEGRATED VOLTAGE DIVIDER

[75] Inventor: Walter Bucksch, Freising, Germany

[73] Assignee: Texas Instruments Deustchland GmbH, Germany

[21] Appl. No.: 458,547

[22] Filed: Jun. 2, 1995

Related U.S. Application Data

[63] Continuation of Ser. No. 67,760, May 26, 1993, abandoned.

[30] Foreign Application Priority Data

May 26, 1992 [DE] Germany ............................ 42 17 408.2

[51] Int. Cl.$^6$ .......................... H01L 29/00; H01L 23/62
[52] U.S. Cl. ......................... 257/536; 257/533; 257/358; 257/360; 257/363; 338/48; 338/79; 338/260; 323/369; 324/704
[58] Field of Search .................... 29/610.1, 617, 29/618, 620; 338/7, 22 SD, 48, 49, 79, 254, 260, 306, 307, 308, 314; 323/364, 367, 369; 324/691, 704, 707; 257/350, 351, 358, 360, 363, 379, 380, 381, 516, 533, 536, 537, 538, 539, 540, 541, 542, 543, 571, 572, 577, 580, 581, 582

[56] References Cited

U.S. PATENT DOCUMENTS

| | | | |
|---|---|---|---|
| 2,777,930 | 1/1957 | Nathanson | 338/254 |
| 4,309,626 | 1/1982 | Kudo | 257/537 |
| 4,727,560 | 2/1988 | Van Zanten et al. | 257/216 |
| 5,215,866 | 6/1993 | Maple | 29/620 |

FOREIGN PATENT DOCUMENTS

| | | | |
|---|---|---|---|
| 62-266861 | 11/1987 | Japan | 257/533 |
| 1-286459 | 11/1989 | Japan | 257/536 |

*Primary Examiner*—Mahshid Saadat
*Assistant Examiner*—Alice W. Tang
*Attorney, Agent, or Firm*—William E. Hiller; Richard L. Donaldson

[57] ABSTRACT

Integrated voltage divider comprising partial resistors (R1, R2) formed of paths of polycrystalline semiconductor material applied over a dielectric layer (4) on a semiconductor substrate (5). Under the paths, each forming a partial resistor (R1,R2) in the semiconductor substrate (5), a well (6 and 7 respectively) is formed having a conductivity type opposite to the conductivity type of the semiconductor substrate (5). The total surfaces of the paths forming the partial resistors (R1,R2) are dimensioned so that their ratio equals the inverse ratio of the resistor values of the two partial resistors (R1, R2).

11 Claims, 2 Drawing Sheets

INTEGRATED VOLTAGE DIVIDER

This application is a continuation of application Ser. No. 08/067,760, filed May 26, 1993, now abandoned.

The invention relates to an integrated voltage divider comprising a first partial resistor in series with a second partial resistor, in which the voltage to be divided can be applied to the ends of the series circuiting of the two partial resistors and the divided voltage can be output at the point connecting the two partial resistors.

BACKGROUND OF THE INVENTION

Voltage dividers are typically produced by connecting two partial resistors in series, at the common connecting point of which part of the voltage applied to the series circuit can be output. As a rule, one end of such a series circuit of the two resistors is connected to a low potential whilst the other end of the series circuit is connected to a point in the circuit of higher potential, the ratio of the drop in voltage across the one partial resistor as compared to that of the other corresponding to the ratio of the resistor values.

When a voltage divider of the aforementioned kind is used to divide a high frequency voltage or a square-wave voltage having a steep slope, the unavoidable stray capacitances accompanying the partial resistors become a disadvantage since the waveform of the divided voltage no longer corresponds to the waveform of the input voltage of the voltage divider. With square-wave voltages these stray capacitances lead, for example, to a more or less pronounced overshoot on the pulse slopes. In a voltage divider used as the input divider of an oscilloscope this behaviour is particularly a nuisance since the negative effects of the stray capacitances are directly evident on the screen, the viewer then not knowing whether he is seeing the correct signal shape corresponding to the input signal or a signal shape which is changed due to the stray capacitances. The effects of the stray capacitances are all the more serious, the higher the frequencies involved and the higher the impedance of the partial resistors.

For frequency compensation of the voltage divider the partial resistors can each be connected in parallel with capacitors which are dimensioned so that the products of the resistor value of the partial resistor and the correspondingly assigned capacitor are the same.

When producing a voltage divider in integrated circuit technology the frequency compensation cannot be attained by connecting the integrated capacitors in parallel with the integrated partial resistors. In the case of integrated partial resistors the stray capacitances are distributed over the full geometrical area of the resistor body and they must not necessarily be located between the two ends of the partial resistor. Apart from this, a considerable stray capacitance with respect to GND exists.

An object of the invention is to create an integrated voltage divider of the kind as mentioned at the outset, the output voltage profile of which represents the input voltage profile irrespective of the frequency of the input voltage.

SUMMARY OF THE INVENTION

The invention achieves this object in that first and second partial resistors are formed of paths of polycrystalline semiconductor material over a dielectric layer which is in turn provided on a semiconductor substrate, that in said semiconductor substrate under each path forming a partial resistor a well is formed having a conductivity type opposite to the conductivity type of said semiconductor substrate, said well assigned to the first partial resistor being connected to one end of a series circuit including the first and second partial resistors and the well assigned to the second partial resistor being connected to the other end of the series circuit and that the total surface areas of the paths forming the separate individual partial resistors are dimensioned so that their ratio equals the inverse ratio of the resistor values of the two partial resistors.

In an integrated voltage divider of a type according to the invention, providing the partial resistors over wells separated in the substrate from each other enables the common points of all stray capacitances assigned to a single partial resistor to be applied to a suitable bias, namely to the voltage at one end of the series circuit or to the voltage at the other end of the series circuit by means of the corresponding well. Defining the surface areas of the paths forming the corresponding partial resistors causes the products of resistance and stray capacitance at the two partial resistors to be equal in each case, as is necessary for the wanted frequency compensation.

BRIEF DESCRIPTION OF THE DRAWINGS

An example of an embodiment of the invention will now be explained in more detail with reference to the drawings in which.

DESCRIPTION OF THE PREFERRED EMBODIMENT

Figure 1:
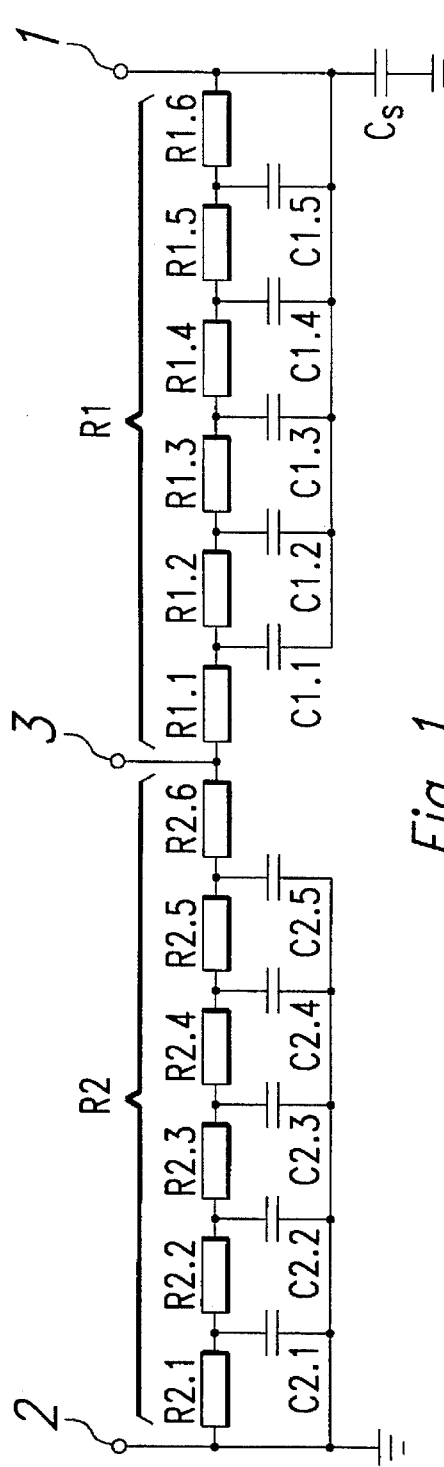
FIG. 1 is an equivalent circuit of an integrated voltage divider according to the invention.

The voltage divider shown in FIG. 1 contains two partial resistors R1 and R2 combined as individual resistors R1.1 thru R1.6 and R2.1 thru R2.6 into a series circuit. This type of representation has been chosen to permit depicting the stray capacitances which in an integrated circuit are not present as individual discrete components but distributed. In FIG. 1 these stray capacitances are identified assigned to the partial resistors R1 and R2 as separate capacitors C1.1 thru C1.5 and C2.1 thru C2.5 respectively. The voltage to be divided is applied between the input 1 of the voltage divider and point 2 connected to GND. The divided voltage can be taken from the output 3.

Figure 2:
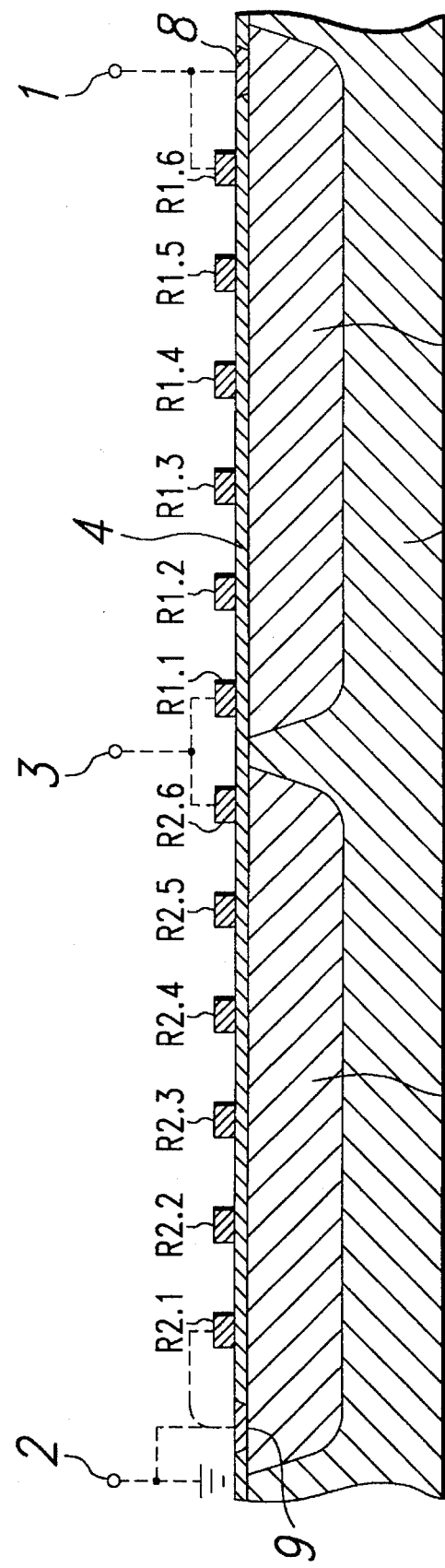
FIG. 2 is a schematic side view of part of an integrated circuit containing a voltage divider according to the invention and FIG. 3 is a plan view of an integrated voltage divider according to the invention in an embodiment as achieved in actual practice to illustrate the course of the paths forming the divider resistors.

The individual resistors R1.1 thru R1.6 and R2.1 thru R2.6 have the form of paths of polycrystalline silicon as evident from the section in FIG. 2. The connections of the individual paths to form the partial resistors R1 and R2 are produced by a suitable configured metallization layer over the paths as is generally practised in integrated circuit technology. This metallization layer is not shown in the drawing to provide a better overview. The connections are indicated merely schematically by dashed lines.

As is evident from FIG. 2 the individual resistors of the partial resistors R1 and R2 are provided on a thin layer 4 of silicon applied to the surface of a semiconductor substrate 5. This semiconductor substrate 5 comprises P-conducting silicon, for example. Under the paths forming the partial resistor R1 and under the paths forming the partial resistor R2, wells 6 and 7 respectively of N-conducting silicon are provided, as evident from FIG. 2. Via a connecting contact 8 the well 6 is connected to the input 1 of the voltage divider, whilst the well 7 is connected to the GND point 2 of the voltage divider via a connecting contact 9.

In the voltage divider as shown in FIG. 2 the layer 4 of silicon oxide has the effect of a dielectric of the stray capitances forming underneath the paths constituting the individual resistors, the path of an individual resistor forming in each case the plate of the stray capacitance assigned to it whilst the well located underneath forms in common the other plate of all stray capacitances. To eliminate the frequency dependency of the transfer characteristic of the integrated voltage divider as shown in FIG. 2 it must be ensured that the stray capacitances assigned to the separate partial resistors R1 and R2 behave inversely to the resistor values of the partial resistors. Since the stray capacitances are directly proportional to the surface areas of the paths forming the individual resistors the aforementioned condition can be satisfied for achieving frequency compensation by influencing the surface areas of the paths.

Since achieving high accuracy of the resistor values and, in particular, achieving good reproducibility of the precise resistor values makes it necessary to use paths of equal width for the individual resistors, the surface area of the paths cannot be made larger simply by making use of wider paths when higher capacitance values are required. The requirement that the capacitance values assigned to the individual resistors must behave inversely to the resistor values involves two conflicting conditions. A small resistor value could be achieved by a short path length, however, this would produce, due to the assumed equal path width, also a correspondingly small surface area and a correspondingly small stray capacitance. A resistor having a small value must, however, have an assigned stray capacitance having a high capacitance value so that the condition for the frequency compensation is satisfied. A small resistor value is thus achieved by dividing a long resistor path, producing the necessary large surface area and thus high capacitance, into several individual resistors and by suitable parallel connection bringing it to the desired small resistor value. Since the partial resistor having the higher resistor value in the voltage divider automatically necessitates a longer path forming it, a greater stray capacitance also results automatically. Since reducing this stray capacitance in the larger partial resistor is not possible, actual practice in configuring an integrated voltage divider is to start with a larger partial resistor, the smaller partial resistor then being configured by connecting the individual paths in parallel to achieve the desired frequency compensation.

In the integrated voltage divider as shown in FIG. 2 the well 6 assigned to the partial resistor R1 is connected to the input 1 to which the voltage to be divided is applied. In this way the unavoidable capacitance lies between the well 6 and the substrate 5 parallel to the input 1 so that it has no effect on the frequency compensation, the unavoidable capacitance merely constituting a capacitive load on the source of the voltage to be divided. By connecting the well 7 assigned to the partial resistor R2 to GND the capacitance between the well 7 and the substrate is short-circuited so that, here too, it has no effect on the frequency compensation.

Figure 3:
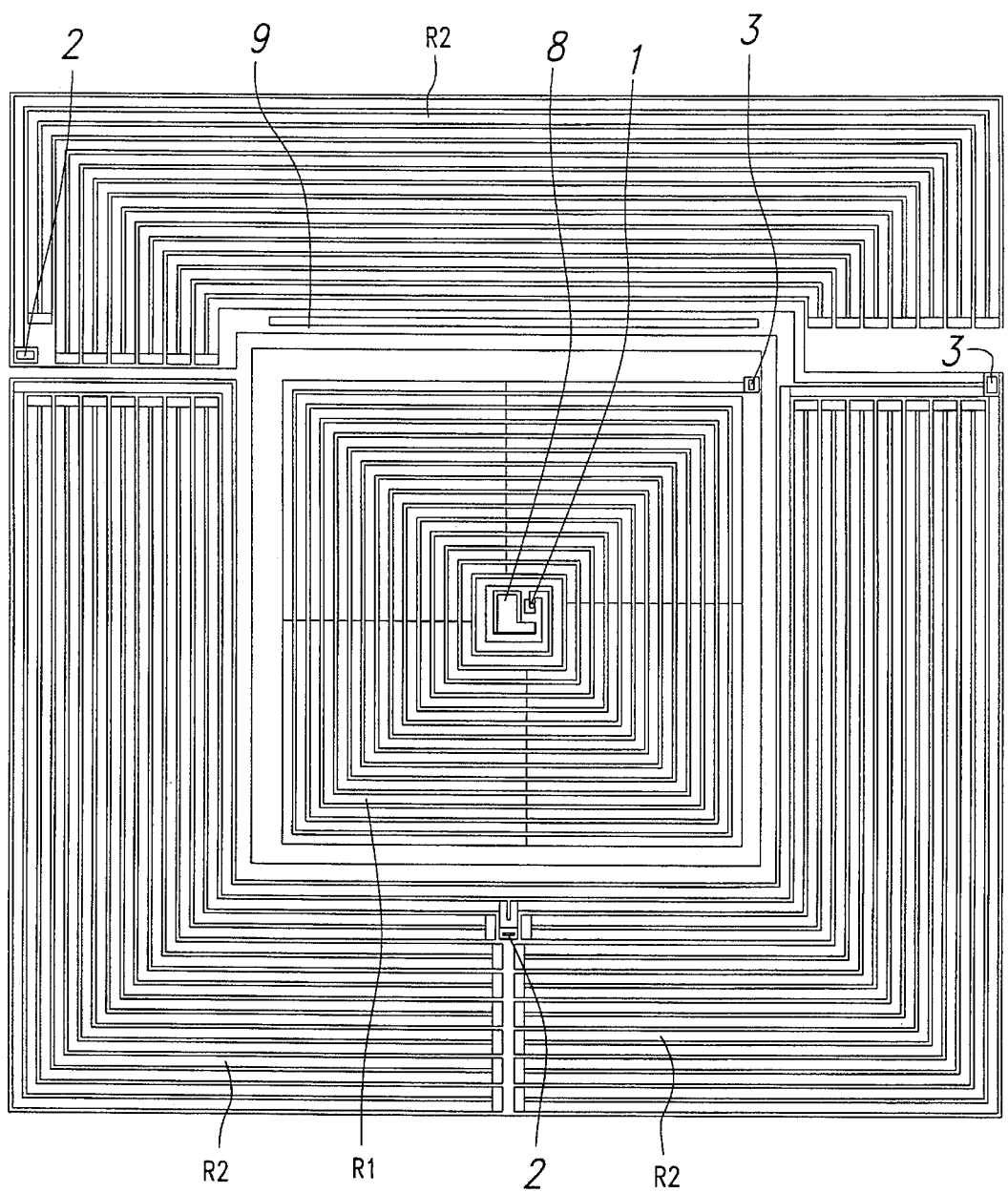

FIG. 3 shows the layout of the integrated voltage divider described. From this layout the course of the paths of the partial resistors R1 and R2 is evident; the metallization layer connecting the individual points in the circuit not being shown.

As indicated, partial resistor R1 is arranged in the middle region of the surface area taken up by the voltage divider. The paths forming the partial resistor R2 surround this middle region, the paths of the partial resistors taking such a course that roughly the same number of components run in one direction as in a direction perpendicular thereto. This layout is selected for several reasons. Due to the fact that the paths forming the partial resistor R2 have the same number of partial path lengths arranged on both sides of the partial resistor R1, temperature compensation of the voltage divider is achieved. When, for example, as shown in FIG. 3 the region of the partial resistor R2 located on the right of the partial resistor R1 has a higher temperature than the region on the left, the effects of temperature on the electrical parameters of the voltage divider as regards the partial resistor R1 having a mean temperature value cancel each other out. By providing just as many paths in the one direction as in the direction perpendicular thereto, compensation as regards mechanical stresses is achieved since in this arrangement the number of paths subject to elongation and compression during mechanical stress is roughly equal.

It should be noted that the described possibility of achieving frequency compensation by configuring the surface areas of the paths forming the divider resistors can be solved mathematically exact. In actual practice, however, this cannot be achieved precisely for all divider ratios desired when, as assumed, paths of equal width are used. Nevertheless an accuracy of frequency compensation can be achieved in actual practice which is completely adequate for very many applications.

So that the inductance of the long paths employed has no effect on the frequency response of the voltage divider, partial lengths of the paths are connected to each other so that the currents in directly neighboring paths each flow in opposite directions, this corresponding to the principle of the bifilar winding of a coil.

The described integrated voltage divider is not only frequency compensated but it is also insensitive to changes in temperature or to mechanical stresses due to the layout as shown in FIG. 3.

I claim:

1. An integrated voltage divider comprising:

a semiconductor substrate of one conductivity type and having a top surface;

first and second wells of the other conductivity type opposite to the one conductivity type of said semiconductor substrate disposed in said semiconductor substrate in spaced relation with respect to each other and respectively opening onto the top surface of said semiconductor substrate;

a dielectric layer disposed on the top surface of said semiconductor substrate and overlying said first and second wells;

first and second partial resistors having their distally-related ends defining opposite ends of a series circuit including said first and second partial resistors and providing respective inputs for receiving a voltage to be divided and their proximally-related ends being connected at a point providing an output at which the divided voltage appears;

said first and second partial resistors being formed of paths of polycrystalline semiconductor material and having respective resistor values, said first and second partial resistors being disposed on said dielectric layer and overlying the corresponding one of said first and second wells;

said first well being connected to the first partial resistor at one end of the series circuit;

said second well being connected to the second partial resistor at the other end of the series circuit; and the paths of polycrystalline semiconductor material forming the first and second partial resistors having respective total surface areas dimensioned so that the ratio of the total surface area of the path of polycrystalline semiconductor material forming the first partial resistor to the total surface area of the path of polycrystalline semiconductor material forming the second partial resistor is equal to the inverse ratio of the resistor value of said first partial resistor to the resistor value of said second partial resistor.

2. An integrated voltage divider as set forth in claim 1 wherein the paths forming said first and second partial resistors have the same width, and the resistor values of said first and second partial resistors are defined by selected series and parallel connections of partial lengths of the paths.

3. An integrated voltage divider as set forth in claim 1, wherein the paths of said first and second partial resistors are arranged on said dielectric layer so that the same number of partial lengths of the paths of each of said first and second partial resistors extend in a first direction as in a second direction perpendicular thereto.

4. An integrated voltage divider as set forth in claim 1, wherein the paths forming each of said first and second partial resistors are arranged to define partial lengths of the first and second partial resistors which are connected to each other so that electrical currents in directly adjacent partial lengths flow in opposite direction.

5. An integrated voltage divider as set forth in claim 1, wherein the paths of said first and second partial resistors are arranged on said dielectric layer so that the paths of said second partial resistor surround the surface area occupied by the paths of said first partial resistor such that the same number of partial lengths of the paths of the surrounding second partial resistor are provided on each of the sides of the surrounded first partial resistor.

6. An integrated voltage divider comprising:

a semiconductor substrate of one conductivity type and having a top surface;

first and second wells of the other conductivity type opposite to the one conductivity type of said semiconductor substrate disposed in said semiconductor substrate in spaced relation with respect to each other and respectively opening onto the top surface of said semiconductor substrate;

a dielectric layer disposed on the top surface of said semiconductor substrate and overlying said first and second wells;

a first partial resistor formed of a first path of polycrystalline semiconductor material arranged spirally in a first quadrilateral configuration;

a second partial resistor formed of plural paths of polycrystalline semiconductor material, said second partial resistor surrounding the first quadrilateral configuration of said first partial resistor and being arranged spirally in a second quadrilateral configuration of a plurality of polycrystalline semiconductor path segments;

the distally-related ends of said first and second partial resistors defining opposite ends of a series circuit including said first and second partial resistors and providing respective inputs for receiving a voltage to be divided and the proximally-related ends of said first and second partial resistors being connected at a point providing an output at which the divided voltage appears;

said first and second partial resistors having respective resistor values and being disposed on said dielectric layer overlying said first and second wells respectively;

said first well being connected to the first partial resistor at one end of the series circuit;

said second well being connected to the second partial resistor at the other end of the series circuit; and the paths of polycrystalline semiconductor material forming the first and second partial resistors having respective total surface areas dimensioned so that the ratio of the total surface area of the path of polycrystalline semiconductor material forming the first partial resistor to the total surface area of the plural paths of polycrystalline semiconductor material forming the second partial resistor is equal to the inverse ratio of the resistor value of said first partial resistor to the resistor value of said second partial resistor.

7. An integrated voltage divider as set forth in claim 6, wherein the paths forming each of said first and second partial resistors have partial lengths which are connected to each other so that the currents in directly adjacent partial lengths flow in opposite directions.

8. An integrated voltage divider as set forth in claim 6, wherein the first path of polycrystalline semiconductor material forming said first partial resistor is continuous.

9. An integrated voltage divider as set forth in claim 8 wherein the paths forming said first and second partial resistors have the same width and the resistor values of said first and second partial resistors are defined by selected series and parallel connections of partial lengths of the paths.

10. An integrated voltage divider as set forth in claim 8, wherein the paths of said first and second partial resistors are arranged on said dielectric layer so that the same number of paths of said second partial resistor extend in a first direction as in a second direction perpendicular to the first direction.

11. An integrated voltage divider as set forth in claim 8, wherein the paths of said first and second partial resistors are arranged on said dielectric layer so that the plural paths of said second partial resistor surround the total surface area occupied by the first path of said first partial resistor such that the same number of partial lengths of the plural paths of the surrounding second partial resistor are provided on each side of the surrounded first partial resistor.

* * * * *